United States Patent
Yonemori (10) Patent No.: US 11,024,571 B2
(45) Date of Patent: Jun. 1, 2021

(54) COIL BUILT-IN MULTILAYER SUBSTRATE AND POWER SUPPLY MODULE

(71) Applicant: Murata Manufacturing Co., Ltd., Nagaokakyo (JP)

(72) Inventor: Keito Yonemori, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 137 days.

(21) Appl. No.: 16/361,277

(22) Filed: Mar. 22, 2019

(65) Prior Publication Data
US 2019/0221511 A1  Jul. 18, 2019

Related U.S. Application Data

(63) Continuation of application No. PCT/JP2017/034081, filed on Sep. 21, 2017.

(30) Foreign Application Priority Data

Oct. 24, 2016 (JP) .............................. JP2016-207425

(51) Int. Cl.
*H01L 23/498* (2006.01)
*H01F 27/32* (2006.01)
(Continued)

(52) U.S. Cl.
CPC ... *H01L 23/49838* (2013.01); *H01F 17/0013* (2013.01); *H01F 27/2804* (2013.01); *H01F 27/29* (2013.01); *H01F 27/323* (2013.01); *H01L 23/49822* (2013.01); *H02M 3/00* (2013.01); *H02M 3/04* (2013.01); *H05K 1/16* (2013.01);
(Continued)

(58) Field of Classification Search
CPC .......................... H01F 2017/002; H02M 3/00
See application file for complete search history.

(56) References Cited

U.S. PATENT DOCUMENTS 6,301,114 B1 * 10/2001 Ootani ................ H01L 23/3677
257/713
2009/0201005 A1    8/2009 Noma et al.
(Continued)

FOREIGN PATENT DOCUMENTS

CN        102598165 A  *  7/2012  ............. H05K 1/165
JP       2005-340586 A    12/2005
(Continued)

OTHER PUBLICATIONS

Official Communication issued in International Patent Application No. PCT/JP2017/034081, dated Dec. 19, 2017.

*Primary Examiner* — Alia Sabur
(74) *Attorney, Agent, or Firm* — Keating & Bennett, LLP (57) ABSTRACT

A coil built-in multilayer substrate includes a multilayer substrate, a coil, interlayer connection conductors, and gaps. The multilayer substrate includes a magnetic layer, a component-mounting land conductor provided on a first principal surface, and a terminal conductor provided on a second principal surface. The coil is provided in the magnetic layer and includes an axis extending in a direction perpendicular or substantially perpendicular to the first and second principal surfaces. The interlayer connection conductors are provided in the magnetic layer in a region inside the spiral coil. Gaps penetrate lateral surfaces of the interlayer connection conductors.

15 Claims, 8 Drawing Sheets

(51) Int. Cl.
*H01F 27/28* (2006.01)
*H05K 1/16* (2006.01)
*H01F 27/29* (2006.01)
*H01F 17/00* (2006.01)
*H02M 3/04* (2006.01)
*H05K 3/46* (2006.01)
*H02M 3/00* (2006.01)

(52) U.S. Cl.
CPC ....... *H05K 3/46* (2013.01); *H01F 2027/2809* (2013.01)

(56) References Cited

U.S. PATENT DOCUMENTS

2010/0061071 A1* 3/2010 Watanabe ............. H01F 27/292
361/782
2015/0015358 A1 1/2015 Yokoyama et al.

FOREIGN PATENT DOCUMENTS

| JP | 4325747 B2 | 9/2009 |
| JP | 2012-065408 A | 3/2012 |
| JP | 2012065408 A * | 3/2012 |
| JP | 2012-164770 A | 8/2012 |
| JP | 2012-243787 A | 12/2012 |
| JP | 2014-216370 A | 11/2014 |
| WO | 2011/058945 A1 | 5/2011 |
| WO | 2013/175655 A1 | 11/2013 |

\* cited by examiner

◄---- :MAGNETIC FIELD

COIL BUILT-IN MULTILAYER SUBSTRATE AND POWER SUPPLY MODULE

CROSS REFERENCE TO RELATED APPLICATIONS

This application claims the benefit of priority to Japanese Patent Application No. 2016-207425 filed on Oct. 24, 2016 and is a Continuation Application of PCT Application No. PCT/JP2017/034081 filed on Sep. 21, 2017. The entire contents of each of these applications are hereby incorporated herein by reference.

BACKGROUND OF THE INVENTION

1. Field of the Invention

The present invention relates to a coil built-in multilayer substrate including a magnetic layer in which a coil is built in, and to a power supply module including the coil built-in multilayer substrate.

2. Description of the Related Art

Japanese Patent No. 4325747 discloses a DC-DC converter module including a magnetic substrate and a surface mount device. A coil defined by a spiral conductor pattern is formed inside the magnetic substrate. Component-mounting land conductors are formed on a first principal surface of the magnetic substrate, and terminal conductors are formed on a second principal surface of the magnetic substrate, the second principal surface opposing to the first principal surface. The surface mount device is mounted to the component-mounting land conductors.

Interlayer connection conductors are formed in the magnetic substrate. The interlayer connection conductors connect the component-mounting land conductors and the terminal conductors. The interlayer connection conductors are formed inside the magnetic substrate in a region between the conductor pattern forming the coil and a lateral surface of the magnetic substrate.

With the configuration disclosed in Japanese Patent No. 4325747, an opening size of the coil must be reduced because the interlayer connection conductors are formed outside the coil. Furthermore, because the interlayer connection conductors penetrate through a magnetic body, a parasitic inductance component is generated.

It is thus difficult to reduce the size of the DC-DC converter module, and to achieve a light load and high efficiency at the same time.

SUMMARY OF THE INVENTION

Preferred embodiments of the present invention provide coil built-in multilayer substrates that are each capable of, in a structure in which a coil is built in a magnetic body, increasing an opening size of the coil, and reducing or preventing parasitic inductance of an interlayer connection conductor.

A coil built-in multilayer substrate according to a preferred embodiment of the present invention includes a multilayer substrate, a coil conductor pattern, an interlayer connection conductor, and a magnetic field interrupting portion. The multilayer substrate includes a magnetic layer, a component-mounting land conductor provided on a first principal surface, and a terminal conductor provided on a second principal surface opposing to the first principal surface. The spiral coil conductor pattern is provided in the magnetic layer and has a shape including an axis extending in a direction perpendicular or substantially perpendicular to the first principal surface and the second principal surface. The interlayer connection conductor is provided in the magnetic layer in a region inside the spiral coil conductor pattern and connects the component-mounting land conductor and the terminal conductor. A magnetic field interrupting portion is defined by a gap in contact with the interlayer connection conductor and extending along a direction in which the interlayer connection conductor extends, or is made of an insulating material disposed in contact with the interlayer connection conductor, extending along the direction in which the interlayer connection conductor extends, and having a lower permeability than that of the magnetic layer.

With the above-described features, since the interlayer connection conductor is provided on the inner side of the spiral coil conductor pattern, an opening size of the coil conductor pattern is able to be increased. Furthermore, a magnetic field generated in a circular or substantially circular shape along a lateral surface of the interlayer connection conductor is interrupted, reduced, or prevented by the magnetic field interrupting portion.

In a coil built-in multilayer substrate according to a preferred embodiment of the present invention, preferably, the magnetic field interrupting portion extends over an entire or substantially entire length of the magnetic layer in a thickness direction thereof.

With the above-described feature, the magnetic field is more reliably interrupted, reduced, or prevented.

In a coil built-in multilayer substrate according to a preferred embodiment of the present invention, the magnetic field interrupting portion may divide the interlayer connection conductor.

With the above-described feature, the magnetic field generated in the circular or substantially circular shape along the lateral surface of the interlayer connection conductor is interrupted, reduced, or prevented by the magnetic field interrupting portion. Furthermore, it is possible to prevent a problem that the magnetic field interrupting portion does not contact the lateral surface of the interlayer connection conductor due to a machining error.

In a coil built-in multilayer substrate according to a preferred embodiment of the present invention, preferably, the magnetic field interrupting portion is in contact with the lateral surface of the interlayer connection conductor.

With the above-described feature, the magnetic field along the lateral surface of the interlayer connection conductor is reliably interrupted, reduced, or prevented.

In a coil built-in multilayer substrate according to a preferred embodiment of the present invention, preferably, the magnetic field interrupting portion is in contact with the interlayer connection conductor at a plurality of positions.

With the above-described feature, the magnetic field generated in the circular or substantially circular shape along the lateral surface of the interlayer connection conductor is more effectively interrupted, reduced, or suppressed.

In a coil built-in multilayer substrate according to a preferred embodiment of the present invention, the interlayer connection conductor includes a first interlayer connection conductor and a second interlayer connection conductor. The magnetic field interrupting portion corresponding to the first interlayer connection conductor and the magnetic field interrupting portion corresponding to the second interlayer connection conductor are connected to each other.

With the above-described features, when a plurality of interlayer connection conductors are provided, the magnetic field around each of the interlayer connection conductors is more effectively interrupted, reduced, or prevented.

In a coil built-in multilayer substrate according to a preferred embodiment of the present invention, preferably, the magnetic field interrupting portion extends to a lateral surface of the magnetic layer, the lateral surface being connected to a first principal surface and a second principal surface of the magnetic layer.

With the above-described feature, the magnetic field generated in the circular or substantially circular shape along the lateral surface of the interlayer connection conductor is more effectively interrupted, reduced, or prevented.

A power supply module according to a preferred embodiment of the present invention includes a coil built-in multilayer substrate and a switching IC mounted to a component-mounting land conductor. The coil built-in multilayer substrate includes a multilayer substrate including a magnetic layer, a mounting land conductor provided on a first principal surface, and a terminal conductor provided on a second principal surface opposing to the first principal surface, and a spiral coil conductor pattern provided in the magnetic layer and including an axis extending in a direction perpendicular or substantially perpendicular to the first principal surface and the second principal surface. The coil built-in multilayer substrate further includes an interlayer connection conductor provided in the magnetic layer in a region inside the spiral coil conductor pattern and connecting the mounting land conductor and the terminal conductor, and a magnetic field interrupting portion defined by a gap in contact with the interlayer connection conductor and extending along a direction in which the interlayer connection conductor extends, or made of an insulating material disposed in contact with the interlayer connection conductor, extending along the direction in which the interlayer connection conductor extends, and having a lower permeability than the magnetic layer. In the power supply module, the coil conductor pattern provided in the magnetic layer defines a choke coil.

With the above-described features, the magnetic field generated in a circular or substantially circular shape along the lateral surface of the interlayer connection conductor connected to the switching IC is interrupted, reduced, or prevented.

In a power supply module according to a preferred embodiment of the present invention, preferably, the interlayer connection conductor is connected to at least one of a grounding terminal, an enable signal input terminal, and a voltage input terminal of the switching IC.

With the above-described feature, characteristics of the switching IC are stabilized.

According to preferred embodiments of the present invention, in a structure in which a coil is built in a magnetic body, an opening size of the coil is able to be increased in the multilayer substrate with a limited area, and parasitic inductance of the interlayer connection conductor is able to be reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described with reference to the accompanying drawings.

Figure 1A:
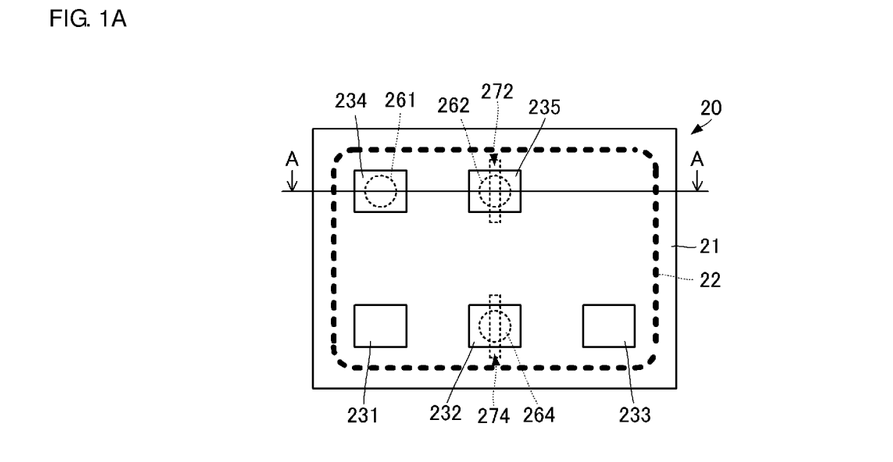
FIG. 1A is a plan view of a first principal surface of a coil built-in multilayer substrate according to a first preferred embodiment of the present invention.
Figure 1B:
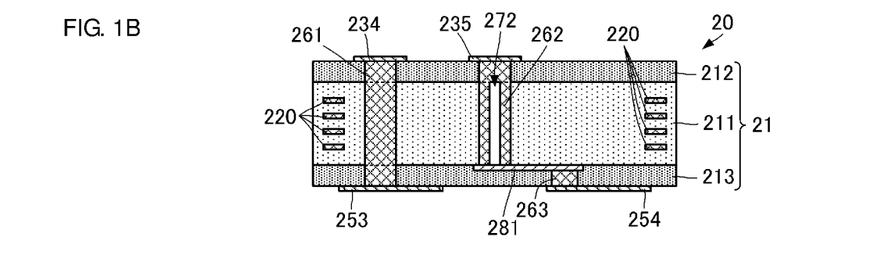
FIG. 1B is a side sectional view of the coil built-in multilayer substrate according to the first preferred embodiment of the present invention.
Figure 1C:
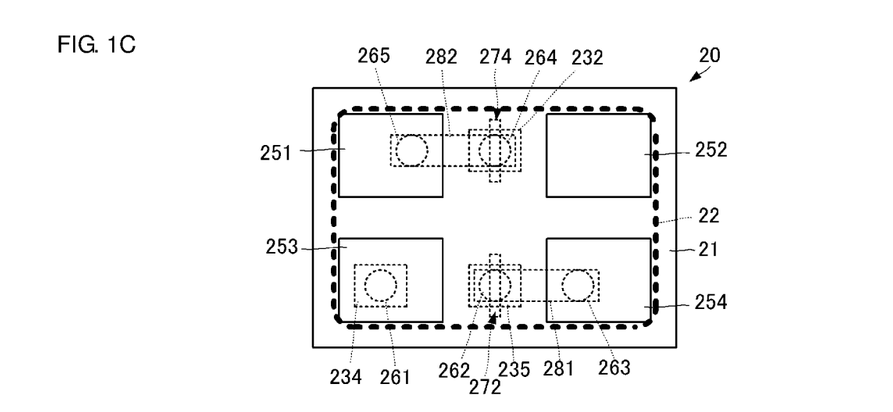
FIG. 1C is a plan view of a second principal surface of the coil built-in multilayer substrate according to the first preferred embodiment of the present invention.
Figure 2:
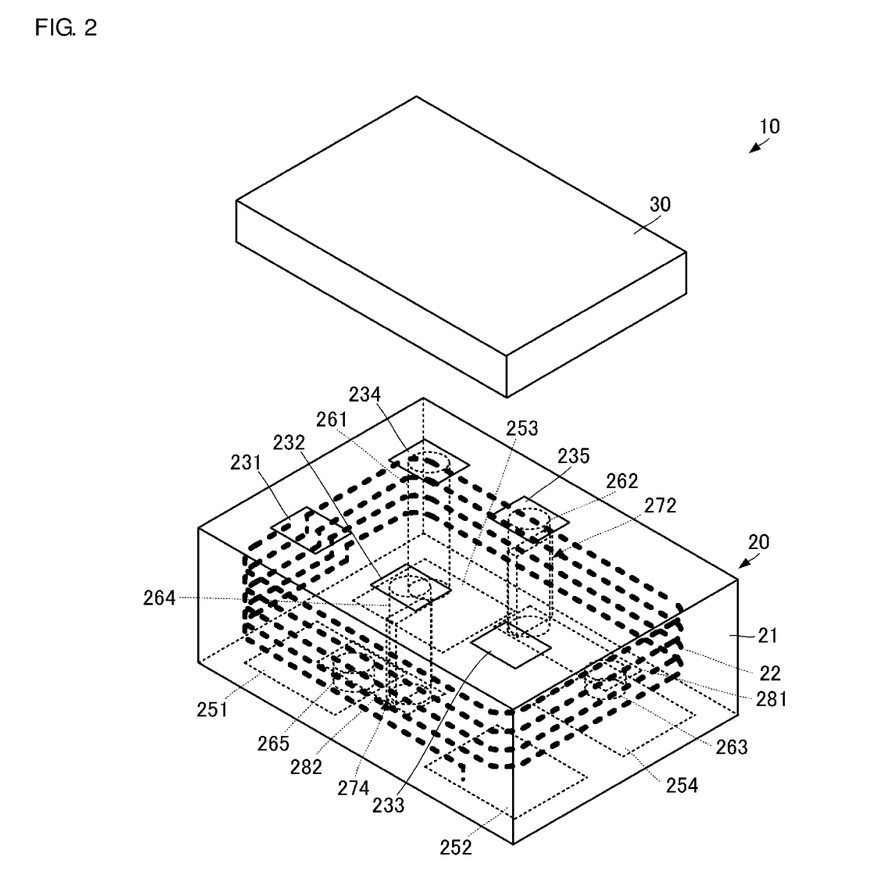
FIG. 2 is an exploded perspective view of a power supply module according to the first preferred embodiment of the present invention.
Figure 3:
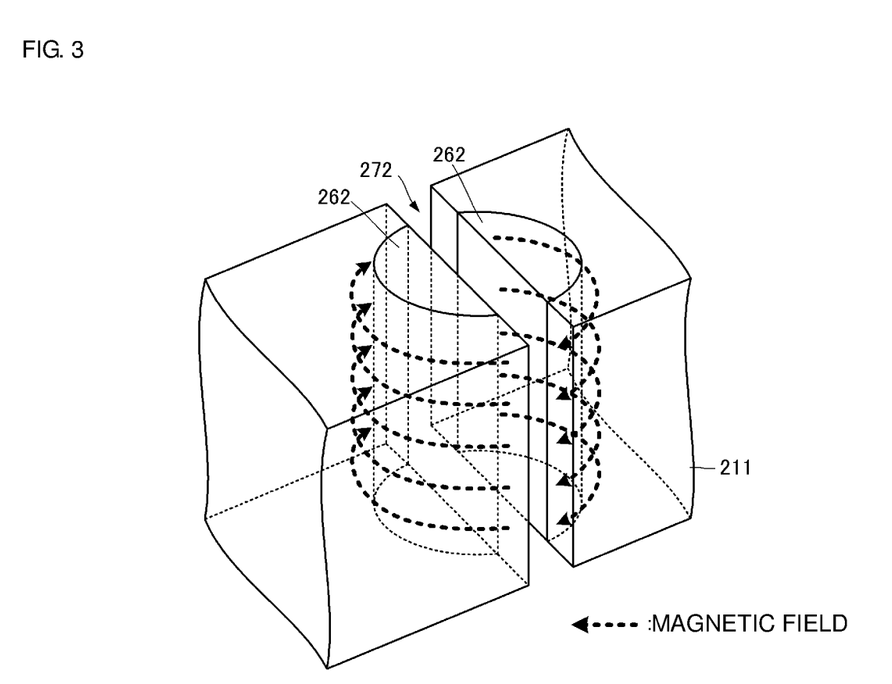
FIG. 3 is an enlarged perspective view of a portion of an interlayer connection conductor including a magnetic field interrupting portion.

A coil built-in multilayer substrate and a power supply module according to a first preferred embodiment of the present invention will be described below with reference to the drawings. FIG. 1A is a plan view of a first principal surface of the coil built-in multilayer substrate according to the first preferred embodiment of the present invention, FIG. 1B is a side sectional view of the coil built-in multilayer substrate according to the first preferred embodiment of the present invention, and FIG. 1C is a plan view of a second principal surface of the coil built-in multilayer substrate according to the first preferred embodiment of the present invention. FIG. 2 is an exploded perspective view of a power supply module according to the first preferred embodiment of the present invention. FIG. 3 is an enlarged perspective view of a portion of an interlayer connection conductor including a magnetic field interrupting portion.

As illustrated in FIGS. 1A-1C and 2, a power supply module 10 includes a coil built-in multilayer substrate 20 and a switching IC 30. The switching IC 30 is mounted on a first principal surface of the coil built-in multilayer substrate 20.

The coil built-in multilayer substrate 20 includes a multilayer substrate 21, a coil 22, mounting land conductors 231, 232, 233, 234 and 235, terminal conductors 251, 252, 253 and 254, interlayer connection conductors 261, 262, 263, 264 and 265, gaps 272 and 274, and wiring conductors 281 and 282.

The multilayer substrate 21 includes a magnetic layer 211 and non-magnetic layers 212 and 213. The non-magnetic layers 212 and 213 may each be a magnetic body having a lower permeability than the magnetic layer 211.

The magnetic layer 211 includes a plurality of magnetic sheets that are laminated. The magnetic layer 211 includes a first principal surface and a second principal surface opposed to each other, and further includes a lateral surface connecting the first principal surface and the second principal surface. The non-magnetic layer 212 is disposed on the first principal surface of the magnetic layer 211. Thus, a first principal surface of the multilayer substrate 21 is defined by a first principal surface of the non-magnetic layer 212. The non-magnetic layer 213 is disposed on the second principal surface of the magnetic layer 211. Thus, a second principal surface of the multilayer substrate 21 is defined by a second principal surface of the non-magnetic layer 213. Thus, the multilayer substrate 21 also includes the first principal surface and the second principal surface opposed to each other, and further includes a lateral surface connecting the first principal surface and the second principal surface.

A coil conductor pattern 220 is provided in or on each of predetermined ones of the magnetic sheets of the magnetic layer 211. The coil conductor patterns 220 in or on the individual magnetic sheets are interconnected by interlayer connection conductors that are not illustrated. Thus, the coil 22 has a spiral shape including an axis parallel or substantially parallel to a direction perpendicular or substantially perpendicular to both of the first principal surface and the second principal surface of the multilayer substrate 21 (i.e., to a thickness direction of the multilayer substrate 21). In such a configuration, the interlayer connection conductors are not disposed between the coil conductor pattern 220 and the lateral surface of the magnetic layer 211, and the coil conductor pattern 220 is disposed close to the lateral surface of the magnetic layer 211. Accordingly, an opening size of the spiral coil 22 is increased within a range satisfying the condition that the coil 22 is built in the multilayer substrate 21. As a result, a coil having a light load and high efficiency is achieved.

The mounting land conductors 231, 232, 233, 234 and 235 are each preferably rectangular or substantially rectangular, for example, when viewed in plan view, and are provided on the first principal surface of the multilayer substrate 21. The terminal conductors 251, 252, 253 and 254 are each preferably rectangular or substantially rectangular, for example, when viewed in plan view, and are provided on the second principal surface of the multilayer substrate 21.

The interlayer connection conductors 261, 262, 263, 264 and 265 are disposed in a region inside the coil 22 when viewing the multilayer substrate 21 in plan view. The interlayer connection conductors 261, 262, 263, 264 and 265 are via hole conductors extending inside the multilayer substrate 21 in the thickness direction, and all of the via hole conductors necessary for the module are preferably disposed within the opening of the coil 22. Even in this case, end-surface electrodes may be disposed on the lateral surface of the multilayer substrate 21.

The interlayer connection conductor 261 penetrates through the multilayer substrate 21 in the thickness direction, and connects the mounting land conductor 234 and the terminal conductor 253.

The interlayer connection conductor 262 penetrates through the non-magnetic layer 212 and the magnetic layer 211 in the multilayer substrate 21, and connects the wiring conductor 281, which is disposed at the interface between the magnetic layer 211 and the non-magnetic layer 213, and the mounting land conductor 235.

The interlayer connection conductor 263 penetrates through the non-magnetic layer 213 in the multilayer substrate 21, and connects the wiring conductor 281 and the terminal conductor 254.

The interlayer connection conductor 264 penetrates through the non-magnetic layer 212 and the magnetic layer 211 in the multilayer substrate 21, and connects the wiring conductor 282, which is disposed at the interface between the magnetic layer 211 and the non-magnetic layer 213, and the mounting land conductor 232.

The interlayer connection conductor 265 penetrates through the non-magnetic layer 213 in the multilayer substrate 21, and connects the wiring conductor 282 and the terminal conductor 251.

The gap 272 is provided in a portion of the magnetic layer 211 at which the interlayer connection conductor 262 is provided. Because gas contained in the gap 272 has a lower permeability than the magnetic layer 211, it provides the same or substantially the same function as that of the "magnetic field interrupting portion". The magnetic field interrupting portion is a region that reduces or prevents an induced magnetic field, which is generated around the interlayer connection conductor, from circling in the shortest path along a peripheral lateral surface of the interlayer connection conductor. The gap 272 is a space preferably having a rectangular or substantially rectangular parallelepiped shape, for example. The gap 272 extends in a direction perpendicular or substantially perpendicular to the lateral surface of the interlayer connection conductor 262 (i.e., a direction parallel or substantially parallel to the first principal surface and the second principal surface of the multilayer substrate 21), and penetrates the lateral surface of the interlayer connection conductor 262 at two positions. Furthermore, the gap 272 extends over the entire or substantially the entire length of the magnetic layer 211 in the thickness direction thereof along a direction in which the interlayer connection conductor 262 extends. In other words, the gap 272 divides, into two portions, the portion of the magnetic layer 211 at which the interlayer connection conductor 262 is provided.

With the above-described structure, as illustrated in FIG. 3, a magnetic field generated in the magnetic layer 211 when a current flows in the interlayer connection conductor 262 is interrupted by the gap 272. Therefore, generation of parasitic inductance by the interlayer connection conductor 262 is reduced or prevented.

The gap 274 is provided in a portion of the magnetic layer 211 at which the interlayer connection conductor 264 is provided. The gap 274 provides the same or substantially the same function as that of the "magnetic field interrupting portion". The gap 274 is a space preferably having a rectangular or substantially rectangular parallelepiped shape, for example. The gap 274 extends in a direction perpendicular or substantially perpendicular to a lateral surface of the interlayer connection conductor 264 (i.e., the direction parallel or substantially parallel to the first principal surface and the second principal surface of the multilayer substrate 21), and penetrates the lateral surface of the interlayer connection conductor 264 at two positions. Furthermore, the gap 274 extends over the entire or substantially the entire length of the magnetic layer 211 in the thickness direction thereof along a direction in which the interlayer connection conductor 264 extends. In other words, the gap 274 divides, into two portions, the portion of the magnetic layer 211 at which the interlayer connection conductor 264 is provided.

With the above-described structure, as with the gap 272 in the interlayer connection conductor 262, a magnetic field generated in the magnetic layer 211 when a current flows in the interlayer connection conductor 264 is interrupted by the gap 274. Therefore, generation of parasitic inductance by the interlayer connection conductor 264 is reduced or prevented.

As described above, since the interlayer connection conductors is disposed inside the coil by using the coil built-in multilayer substrate according to the present preferred embodiment, the opening of the coil is able to be increased, and the generation of parasitic inductance by the interlayer connection conductors is able to be reduced or prevented.

The gaps 272 and 274 may be provided partially in the thickness direction of the magnetic layer 211. However, providing the gaps 272 and 274 over the entire or substantially the entire length of the magnetic layer 211 in the thickness direction is more advantageous because the effect of interrupting, reducing, or preventing the magnetic field is increased.

Although, in the power supply module 10, the interlayer connection conductor 261 does not include a gap similar to the gaps provided in the interlayer connection conductors 262 and 264, a similar gap may be provided in the interlayer connection conductor 261 as well.

The coil built-in multilayer substrate 20 having the above-described structure is manufactured, for example, through the following non-limiting steps.

First, the magnetic layer 211 before sintering is formed by laminating a plurality of magnetic ceramic green sheets on each of which the coil conductor pattern 220 is formed. Then, through-holes for the interlayer connection conductors 261, 262 and 264 are bored in the magnetic layer 211 before sintering, and the interlayer connection conductors 261, 262 and 264 are formed in the through-holes. Then, voids that define the gaps 272 and 274 are formed in portions of the magnetic layer 211 before sintering, the portions including the interlayer connection conductors 262 and 264. Then, the non-magnetic layer 212 formed of a non-magnetic ceramic green sheet is disposed in contact with the first principal surface of the magnetic layer 211, and the non-magnetic layer 213 is disposed in contact with the second principal surface of the magnetic layer 211. At this time, portions of the interlayer connection conductors 262 and 264 are previously formed in the non-magnetic layer 212. Furthermore, the wiring conductors 281 and 282 are previously formed in the non-magnetic layer 213. Then, the multilayer substrate 21 is sintered such that the magnetic layer 211 is sandwiched between the non-magnetic layers 212 and 213.

Figure 4:
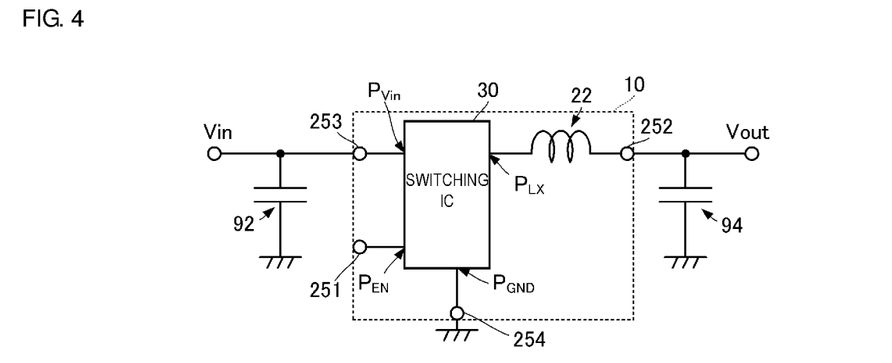
FIG. 4 is a circuit diagram of a power supply circuit according to the first preferred embodiment of the present invention.

The power supply module 10 including the above-described coil built-in multilayer substrate 20 is included in a power supply circuit illustrated in FIG. 4. FIG. 4 is a circuit diagram of a power supply circuit according to the first preferred embodiment of the present invention.

As illustrated in FIG. 4, the power supply circuit includes the coil 22, the switching IC 30, an input capacitor 92, an output capacitor 94, a voltage input terminal Vin, and a voltage output terminal Vout. The coil 22 defines a choke coil is connected between the voltage input terminal Vin and the voltage output terminal Vout. The switching IC 30 is connected to the coil 22 at the side closer to the voltage input terminal Vin. The input capacitor 92 is connected between the voltage input terminal Vin and a reference potential (ground potential). The output capacitor 94 is connected between the voltage output terminal Vout and the reference potential (ground potential).

The switching IC 30 includes an input terminal $P_{Vin}$, a coil-side terminal $P_{LX}$, an enable signal input terminal $P_{EN}$, and a ground terminal $P_{GND}$. The input terminal $P_{Vin}$ is mounted to the mounting land conductor 234 of the coil built-in multilayer substrate 20, and is connected to the voltage input terminal Vin via the terminal conductor 253 of the power supply module 10. The enable signal input terminal $P_{EN}$ is mounted to the mounting land conductor 232 of the coil built-in multilayer substrate 20, and is connected to the terminal conductor 251 of the power supply module 10. The ground terminal $P_{GND}$ is mounted to the mounting land conductor 235 of the coil built-in multilayer substrate 20, and is connected to the reference potential (ground potential) via the terminal conductor 254 of the power supply module 10.

With the above-described configuration, the power supply circuit functions as a step-down DC-DC converter. In other words, the power supply module 10 functions as a DC-DC converter module. Furthermore, in the above-described configuration, the gap 272 is provided in the interlayer connection conductor 262 that defines a conductor path connecting the switching IC 30 to the reference potential, and the gap 274 is provided in the interlayer connection conductor 264 through which an enable signal is transferred. As a result, the operation of the switching IC 30 is stabilized, switching characteristics are improved, and a stable output is obtained. In addition, since the coil built-in multilayer substrate 20 has the above-described structure, a power supply circuit having a light load and high efficiency is able to be realized.

Generally, in the case of reducing the size of the power supply circuit having a light load and high efficiency, the opening size of the coil is reduced. In trying to achieve, for example, a DC-DC converter of not more than about 50 mA when driving in a PFM mode, influences of iron losses (i.e., hysteresis loss and eddy current loss) attributable to a core material of a magnetic layer on efficiency characteristics and coil characteristics are significant. The hysteresis loss is proportional to the square of a magnetic flux density.

To achieve high efficiency under a light load, therefore, the hysteresis loss needs to be reduced. Here, if the core material is not changed, the opening size of the coil needs to be increased. Thus, with the coil built-in multilayer substrate 20 according to a preferred embodiment of the present invention, it is possible to increase the opening size of the coil, and to achieve a power supply circuit having a light load and high efficiency.

Figure 5A:
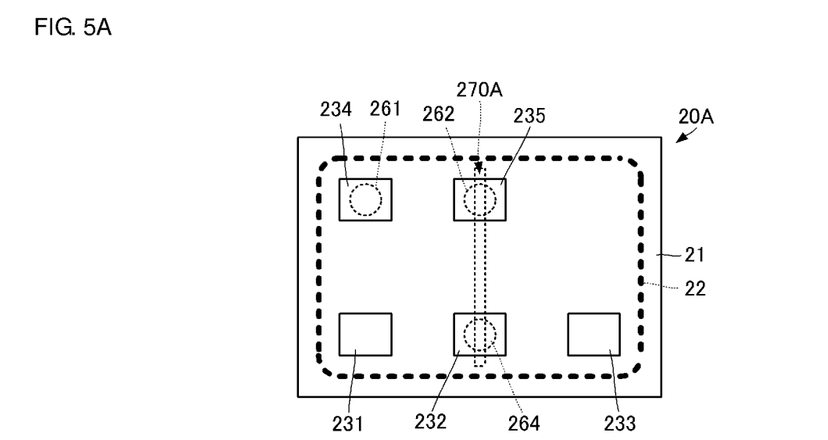
FIG. 5A is a plan view of a first principal surface of a coil built-in multilayer substrate according to a second preferred embodiment of the present invention.
Figure 5B:
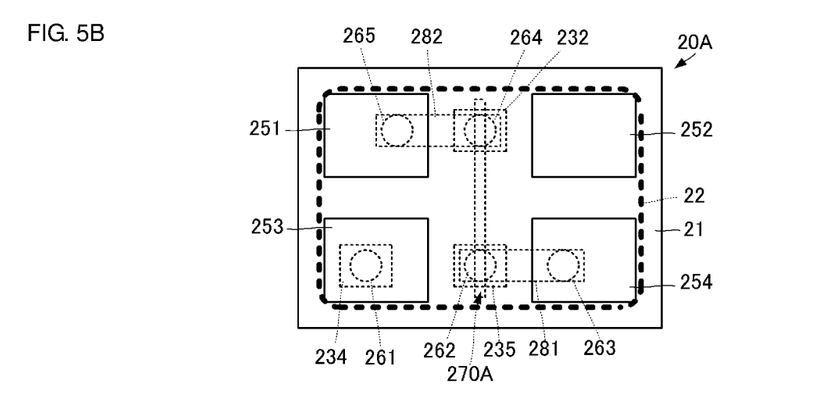
FIG. 5B is a plan view of a second principal surface of the coil built-in multilayer substrate according to the second preferred embodiment of the present invention.

A coil built-in multilayer substrate according to a second preferred embodiment of the present invention will be described below with reference to the drawings. FIG. 5A is a plan view of a first principal surface of the coil built-in multilayer substrate according to the second preferred embodiment of the present invention. FIG. 5B is a plan view of a second principal surface of the coil built-in multilayer substrate according to the second preferred embodiment of the present invention.

As illustrated in FIGS. 5A and 5B, a coil built-in multilayer substrate 20A according to the present preferred embodiment is different from the coil built-in multilayer substrate 20 according to the first preferred embodiment in that it includes a gap 270A. The remaining structure of the coil built-in multilayer substrate 20A is the same as or similar to that of the coil built-in multilayer substrate 20 according to the first preferred embodiment, and description of the same or similar elements is omitted.

The coil built-in multilayer substrate 20A includes the gap 270A. The gap 270A corresponds to a "magnetic field interrupting portion". The gap 270A penetrates through the interlayer connection conductor 262 and the interlayer connection conductor 264. In other words, the gap 270A continuously joins the gap 272 and the gap 274 in the first preferred embodiment to each other.

Also with the above-described structure, as in the first preferred embodiment, the opening of the coil is able to be increased, and the generation of parasitic inductance by the interlayer connection conductors is able to be reduced or prevented. Moreover, in the structure of the present preferred embodiment, the gap 270A continuously extends from the lateral surface of the interlayer connection conductor 262 to the lateral surface of the interlayer connection conductor 264 in the magnetic layer 211. Therefore, the generation of parasitic inductance by the interlayer connection conductors is able to be more effectively reduced or prevented.

Figure 6A:
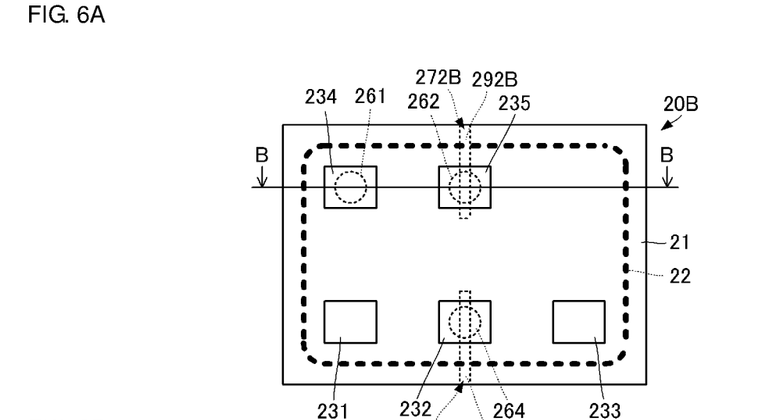
FIG. 6A is a plan view of a first principal surface of a coil built-in multilayer substrate according to a third preferred embodiment of the present invention.
Figure 6B:
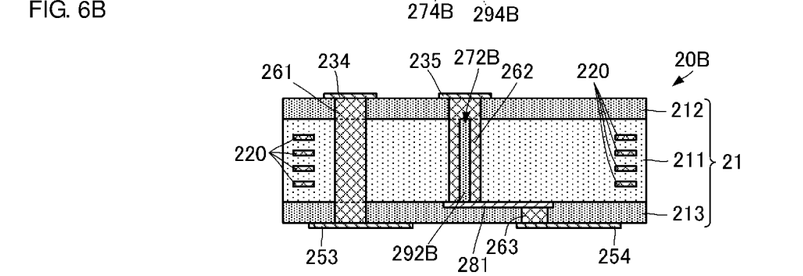
FIG. 6B is a side sectional view of the coil built-in multilayer substrate according to the third preferred embodiment of the present invention.
Figure 6C:
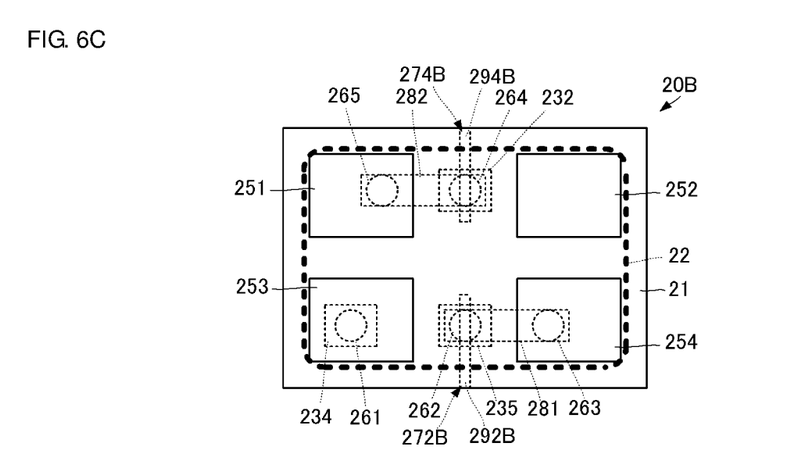
FIG. 6C is a plan view of a second principal surface of the coil built-in multilayer substrate according to the third preferred embodiment of the present invention.
Figure 7:
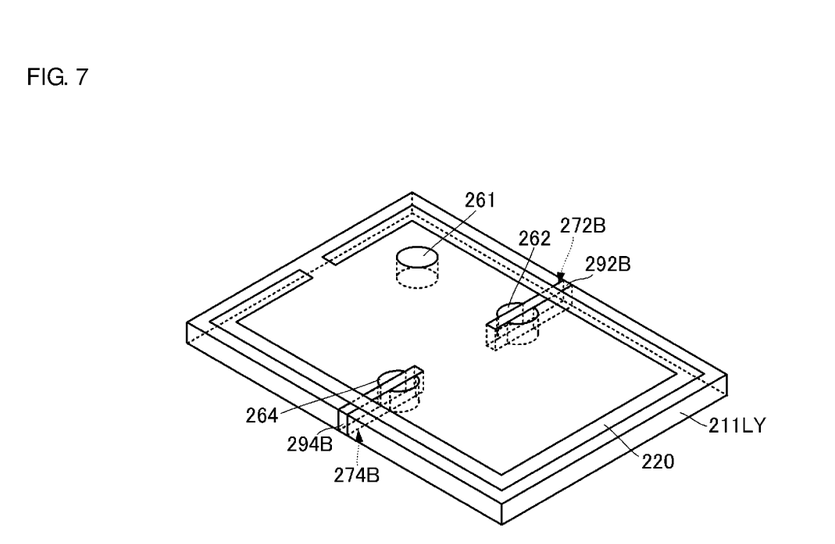
FIG. 7 is a perspective view illustrating a configuration of one of magnetic sheets of a magnetic layer of the coil built-in multilayer substrate according to the third preferred embodiment of the present invention.

A coil built-in multilayer substrate according to a third preferred embodiment of the present invention will be described below with reference to the drawings. FIG. 6A is a plan view of a first principal surface of the coil built-in multilayer substrate according to the third preferred embodiment of the present invention. FIG. 6B is a side sectional view of the coil built-in multilayer substrate according to the third preferred embodiment of the present invention. FIG. 6C is a plan view of a second principal surface of the coil built-in multilayer substrate according to the third preferred embodiment of the present invention. FIG. 7 is a perspective view illustrating a configuration of one of magnetic sheets of a magnetic layer of the coil built-in multilayer substrate according to the third preferred embodiment of the present invention.

As illustrated in FIGS. 6A to 6C, a coil built-in multilayer substrate 20B according to the present preferred embodiment is different from the coil built-in multilayer substrate 20 according to the first preferred embodiment in that it includes gaps 272B and 274B. The remaining structure of the coil built-in multilayer substrate 20B is the same as or similar to that of the coil built-in multilayer substrate 20, and description of the same or similar elements is omitted.

The coil built-in multilayer substrate 20B includes the gaps 272B and 274B.

The gap 272B penetrates through the interlayer connection conductor 262 and is opened at the lateral surface of the magnetic layer 211 in a position closest to the interlayer connection conductor 262. A non-magnetic substance 292B is filled in the gap 272B. The non-magnetic substance 292B may be replaced with a material having a lower permeability than the magnetic layer 211.

The gap 274B penetrates through the interlayer connection conductor 264 and is opened at the lateral surface of the magnetic layer 211 in a position closest to the interlayer connection conductor 264. A non-magnetic substance 294B is filled in the gap 274B. The non-magnetic substance 294B may be replaced with an insulating material having a lower permeability than the magnetic layer 211. Each of the non-magnetic substances 292B and 294B corresponds to the "magnetic field interrupting portion". The material having a lower permeability than the magnetic layer 211 is preferably a ceramic material that is able to be co-fired with the magnetic ceramic green sheets of the magnetic layer 211.

Also with the above-described structure, as in the first preferred embodiment, the opening of the coil is able to be increased, and the generation of parasitic inductance by the interlayer connection conductors is able to be reduced or prevented. Moreover, in the structure of the present preferred embodiment, the non-magnetic substance 292B filled in the gap 272B and the non-magnetic substance 294B filled in the gap 274B extend until reaching the lateral surface of the magnetic layer 211. Therefore, the generation of parasitic inductance by the interlayer connection conductors is able to be more effectively reduced or prevented.

In the above case, the magnetic layer of the coil built-in multilayer substrate 20B is defined by a magnetic sheet 211LY having the configuration illustrated in FIG. 7.

First, a plurality of through-holes are bored in the magnetic sheet 211LY, and the interlayer connection conductors 261, 262 and 264 are formed therein. Then, after forming the gaps 272B and 274B in the magnetic sheet 211LY, the non-magnetic substance 292B is filled into the gap 272B, and the non-magnetic substance 294B is filled into the gap 274B. In that state, the magnetic sheet 211LY and the non-magnetic substances 292B and 294B are calcined. Then, the coil conductor pattern 220 is formed on a first principal surface of the magnetic sheet 211LY including the non-magnetic substances 292B and 294B.

Figure 8A:
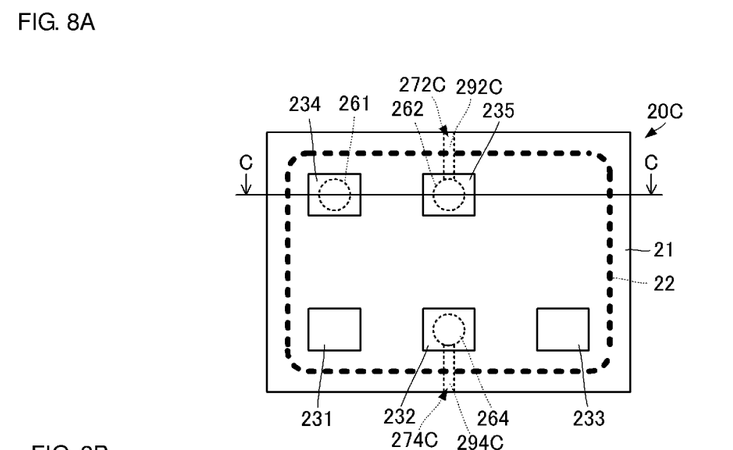
FIG. 8A is a plan view of a first principal surface of a coil built-in multilayer substrate according to a fourth preferred embodiment of the present invention.
Figure 8B:
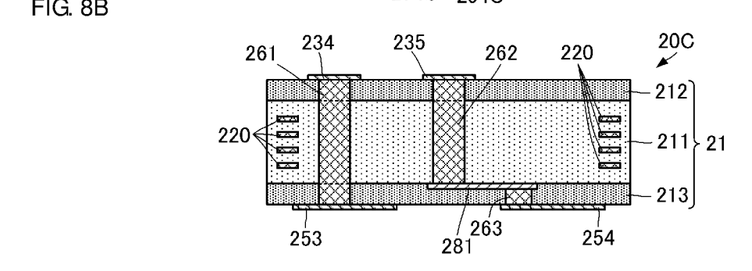
FIG. 8B is a side sectional view of the coil built-in multilayer substrate according to the fourth preferred embodiment of the present invention.
Figure 8C:
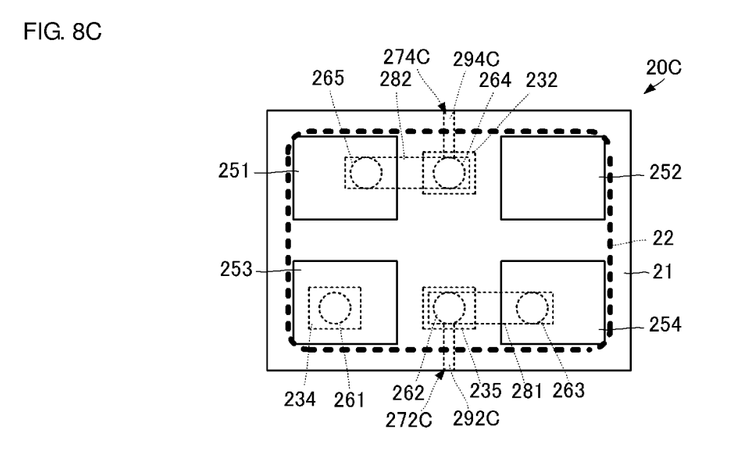
FIG. 8C is a plan view of a second principal surface of the coil built-in multilayer substrate according to the fourth preferred embodiment of the present invention.
Figure 9:
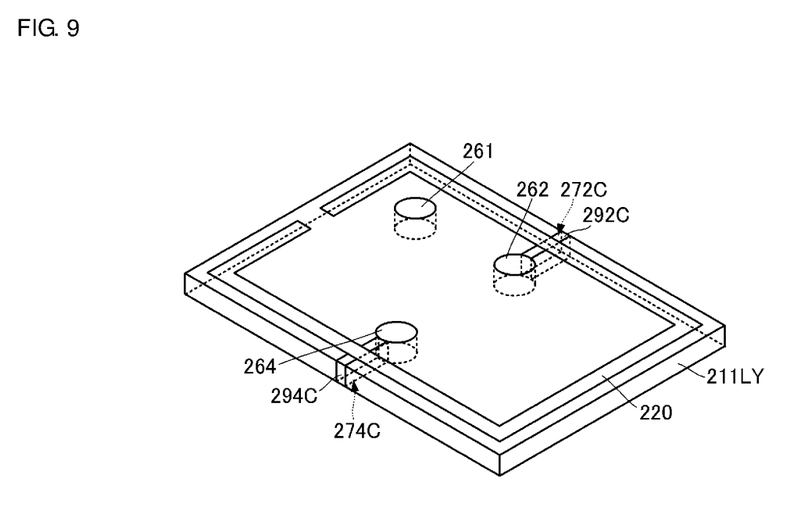
FIG. 9 is a perspective view illustrating a configuration of one of magnetic sheets of a magnetic layer of the coil built-in multilayer substrate according to the fourth preferred embodiment of the present invention.

A coil built-in multilayer substrate according to a fourth preferred embodiment of the present invention will be described below with reference to the drawings. FIG. 8A is a plan view of a first principal surface of the coil built-in multilayer substrate according to the fourth preferred embodiment of the present invention. FIG. 8B is a side sectional view of the coil built-in multilayer substrate according to the fourth preferred embodiment of the present invention. FIG. 8C is a plan view of a second principal surface of the coil built-in multilayer substrate according to the fourth preferred embodiment of the present invention. FIG. 9 is a perspective view illustrating a configuration of one of magnetic sheets of a magnetic layer of the coil built-in multilayer substrate according to the fourth preferred embodiment of the present invention.

As illustrated in FIGS. 8A to 8C, a coil built-in multilayer substrate 20C according to the present preferred embodiment is different from the coil built-in multilayer substrate 20B according to the third preferred embodiment in that it includes gaps 272C and 274C. The remaining structure of the coil built-in multilayer substrate 20C is the same as or similar to that of the coil built-in multilayer substrate 20B, and description of the same or similar elements is omitted.

The coil built-in multilayer substrate 20C includes the gaps 272C and 274C.

The gap 272C does not penetrate through the interlayer connection conductor 262, and the gap 272C includes one end defined by the lateral surface of the interlayer connection conductor 262 and the other end opened at the lateral surface of the magnetic layer 211 in a position closest to the interlayer connection conductor 262. A non-magnetic substance 292C is filled in the gap 272C. Thus, the non-magnetic substance 292C is in contact with the lateral surface of the interlayer connection conductor 262. The non-magnetic substance 292C may be replaced with a material having a lower permeability than the magnetic layer 211.

The gap 274C does not penetrate through the interlayer connection conductor 264, and the gap 274C includes one end defined by the lateral surface of the interlayer connection conductor 264 and the other end opened at the lateral surface of the magnetic layer 211 in a position closest to the interlayer connection conductor 264. A non-magnetic substance 294C is filled in the gap 274C. Thus, the non-magnetic substance 294C is in contact with the lateral surface of the interlayer connection conductor 264. The non-magnetic substance 294C may be replaced with a material having a lower permeability than the magnetic layer 211.

Also with the above-described structure, as in the third preferred embodiment, the opening of the coil is able to be increased, and the generation of parasitic inductance by the interlayer connection conductors is able to be reduced or prevented. Moreover, in the structure of the present preferred embodiment, the gap 272C (non-magnetic substance 292C) does not penetrate through the interlayer connection conductor 262 and is in contact with the lateral surface of the interlayer connection conductor 262. The gap 274C (non-magnetic substance 294C) does not penetrate through the interlayer connection conductor 264 and is in contact with the lateral surface of the interlayer connection conductor 264. Therefore, a sectional area of each of the interlayer connection conductors in the magnetic layer 211 is able to be increased, and a resistance is reduced.

In the above case, the magnetic layer of the coil built-in multilayer substrate 20C is defined by a magnetic sheet 211LY having the configuration illustrated in FIG. 9.

First, a plurality of through-holes are bored in the magnetic sheet 211LY, and the interlayer connection conductors 261, 262 and 264 are formed therein. Then, after forming the gaps 272C and 274C in the magnetic sheet 211LY, the non-magnetic substance 292C is filled into the gap 272C, and the non-magnetic substance 294C is filled into the gap 274C. In that state, the magnetic sheet 211LY and the non-magnetic substances 292C and 294C are calcined. Then, the coil conductor pattern 220 is formed on a first principal surface of the magnetic sheet 211LY including the non-magnetic substances 292C and 294C.

Although, in the above-described preferred embodiments, the gap or the non-magnetic substance contacts with or penetrates through the lateral surface of the interlayer connection conductor at only one position or at two positions along a periphery thereof, it may contact or penetrate at three or more positions. However, the number of such positions is preferably two or more (i.e., a plurality) because the above-described advantageous effects are able to be more effectively obtained.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A coil built-in multilayer substrate comprising:
a multilayer substrate including a magnetic layer, a mounting land conductor provided on a first principal surface, and a terminal conductor provided on a second principal surface opposed to the first principal surface;
a spiral coil conductor pattern provided on or in the magnetic layer and including an axis extending in a direction perpendicular or substantially perpendicular to the first principal surface and the second principal surface;
an interlayer connection conductor provided on or in the magnetic layer in a region inside the spiral coil conductor pattern and connecting the mounting land conductor and the terminal conductor; and
a magnetic field interrupting portion defined by a gap in contact with the interlayer connection conductor and extending along a direction in which the interlayer connection conductor extends, or made of an insulating material disposed in contact with the interlayer connection conductor, extending along the direction in which the interlayer connection conductor extends, and having a lower permeability than the magnetic layer; wherein
a cross-sectional shape of the magnetic field interrupting portion is different from a cross-sectional shape of the interlayer connection conductor.

2. The coil built-in multilayer substrate according to claim 1, wherein the magnetic field interrupting portion extends over an entire or substantially an entire length of the magnetic layer in a thickness direction thereof.

3. The coil built-in multilayer substrate according to claim 1, wherein the magnetic field interrupting portion divides the interlayer connection conductor.

4. The coil built-in multilayer substrate according to claim 1, wherein the magnetic field interrupting portion is in contact with a lateral surface of the interlayer connection conductor.

5. The coil built-in multilayer substrate according to claim 1, wherein the magnetic field interrupting portion is in contact with the interlayer connection conductor at a plurality of positions.

6. The coil built-in multilayer substrate according to claim 1, wherein
the interlayer connection conductor includes a first interlayer connection conductor and a second interlayer connection conductor;
each of the first and second interlayer connection conductors includes the magnetic field interrupting portion; and
the magnetic field interrupting portion corresponding to the first interlayer connection conductor and the magnetic field interrupting portion corresponding to the second interlayer connection conductor are connected to each other.

7. The coil built-in multilayer substrate according to claim 1, wherein the magnetic field interrupting portion extends to a lateral surface of the magnetic layer, the lateral surface connecting a first principal surface and a second principal surface of the magnetic layer.

8. A power supply module comprising:
a coil built-in multilayer substrate including a multilayer substrate including a magnetic layer, a mounting land conductor provided on a first principal surface, and a terminal conductor provided on a second principal surface opposed to the first principal surface, and a spiral coil conductor pattern provided on or in the magnetic layer and including an axis extending in a direction perpendicular or substantially perpendicular to the first principal surface and the second principal surface; and
a switching IC mounted on the mounting land conductor; wherein
the coil built-in multilayer substrate further comprises:
an interlayer connection conductor provided on or in the magnetic layer in a region inside the spiral coil conductor pattern and connecting the mounting land conductor and the terminal conductor; and
a magnetic field interrupting portion defined by a gap in contact with the interlayer connection conductor and extending along a direction in which the interlayer connection conductor extends, or made of an insulating material disposed in contact with the interlayer connection conductor, extending along the direction in which the interlayer connection conductor extends, and having a lower permeability than the magnetic layer;

the spiral coil conductor pattern defines a choke coil; and a cross-sectional shape of the magnetic field interrupting portion is different from a cross-sectional shape of the interlayer connection conductor.

9. The power supply module according to claim 8, wherein the interlayer connection conductor is connected to at least one of a grounding terminal, an enable signal input terminal, and a voltage input terminal for the switching IC.

10. The power supply module according to claim 8, wherein the magnetic field interrupting portion extends over an entire or substantially an entire length of the magnetic layer in a thickness direction thereof.

11. The power supply module according to claim 8, wherein the magnetic field interrupting portion divides the interlayer connection conductor.

12. The power supply module according to claim 8, wherein the magnetic field interrupting portion is in contact with a lateral surface of the interlayer connection conductor.

13. The power supply module according to claim 8, wherein the magnetic field interrupting portion is in contact with the interlayer connection conductor at a plurality of positions.

14. The power supply module according to claim 8, wherein
the interlayer connection conductor includes a first interlayer connection conductor and a second interlayer connection conductor;
each of the first and second interlayer connection conductors includes the magnetic field interrupting portion; and
the magnetic field interrupting portion corresponding to the first interlayer connection conductor and the magnetic field interrupting portion corresponding to the second interlayer connection conductor are connected to each other.

15. The power supply module according to claim 8, wherein the magnetic field interrupting portion extends to a lateral surface of the magnetic layer, the lateral surface connecting a first principal surface and a second principal surface of the magnetic layer.

* * * * *